United States Patent
Sundararajan et al.

(10) Patent No.: US 7,634,127 B1
(45) Date of Patent: Dec. 15, 2009

(54) EFFICIENT STORAGE OF FAIL DATA TO AID IN FAULT ISOLATION

(75) Inventors: Srikanth Sundararajan, Sunnyvale, CA (US); Siu May Ho, Sunnyvale, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 655 days.

(21) Appl. No.: 10/884,333

(22) Filed: Jul. 1, 2004

(51) Int. Cl.
*G06K 9/00* (2006.01)
*G01R 31/26* (2006.01)
(52) U.S. Cl. .................... 382/145; 438/14
(58) Field of Classification Search ........... 382/145
See application file for complete search history.

(56) References Cited

U.S. PATENT DOCUMENTS

| | | | | |
|---|---|---|---|---|
| 3,830,717 | A * | 8/1974 | Singer et al. .......... 204/192.25 |
| 5,475,695 | A | 12/1995 | Caywood et al. |
| 5,515,453 | A * | 5/1996 | Hennessey et al. .......... 382/141 |
| 5,872,862 | A * | 2/1999 | Okubo et al. .............. 382/151 |
| 6,137,295 | A * | 10/2000 | Yoshida ...................... 324/751 |
| 6,292,582 | B1 * | 9/2001 | Lin et al. ..................... 382/149 |
| 6,330,053 | B1 * | 12/2001 | Takayama .................... 355/77 |
| 6,333,992 | B1 * | 12/2001 | Yamamura et al. .......... 382/149 |
| 6,396,945 | B1 * | 5/2002 | Ishii ............................ 382/149 |
| 6,456,951 | B1 * | 9/2002 | Maeda et al. .................. 702/81 |
| 6,483,938 | B1 * | 11/2002 | Hennessey et al. .......... 382/149 |
| 6,487,307 | B1 * | 11/2002 | Hennessey et al. .......... 382/149 |
| 6,539,106 | B1 * | 3/2003 | Gallarda et al. ............. 382/149 |
| 6,577,757 | B1 * | 6/2003 | DeYong et al. ............. 382/149 |
| 6,868,175 | B1 * | 3/2005 | Yamamoto et al. ......... 382/145 |
| 2001/0053243 | A1 * | 12/2001 | Norioka et al. ............. 382/145 |
| 2002/0100872 | A1 * | 8/2002 | Hiroi et al. .................. 250/310 |
| 2002/0168098 | A1 * | 11/2002 | DeYong et al. ............. 382/145 |
| 2003/0016858 | A1 * | 1/2003 | DeYong et al. ............. 382/149 |
| 2003/0050761 | A1 * | 3/2003 | Okabe et al. .................. 702/82 |
| 2003/0053677 | A1 * | 3/2003 | DeYong et al. ............. 382/149 |
| 2003/0058436 | A1 * | 3/2003 | Ono et al. ................ 356/237.2 |
| 2003/0067496 | A1 * | 4/2003 | Tasker et al. ................ 345/846 |
| 2003/0076989 | A1 * | 4/2003 | Maayah et al. ............. 382/145 |
| 2003/0228049 | A1 * | 12/2003 | Asai ........................... 382/145 |
| 2003/0228050 | A1 * | 12/2003 | Geshel et al. .............. 382/149 |
| 2004/0121496 | A1 * | 6/2004 | Brankner et al. ............. 438/14 |

* cited by examiner

*Primary Examiner*—Bhavesh M Mehta
*Assistant Examiner*—David P Rashid
(74) *Attorney, Agent, or Firm*—Farjami & Farjami LLP

(57) ABSTRACT

A method and system for fault isolation in semiconductor with devices thereon includes determining test data from a plurality of semiconductor devices and creating a failure bitmap of locations of the plurality of semiconductor devices and test data in a vector graphic CAD format. The vector graphic CAD format allows storage of test data on multiple layers.

20 Claims, 3 Drawing Sheets

EFFICIENT STORAGE OF FAIL DATA TO AID IN FAULT ISOLATION

BACKGROUND

1. Technical Field

The present invention relates generally to semiconductor technology and more specifically to semiconductor research and development.

2. Background Art

At the present time, electronic products are used in almost every aspect of life, and the heart of these electronic products is the integrated circuit. Integrated circuits are used in everything from cars and clocks to telephones.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but on only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems. For example, during the production of semiconductor devices, in-line defect inspections are conducted to obtain defect data about the devices. In-line defects are detected by inspection techniques conducted between process steps for fabricating the semiconductor devices. (Actual defects are determined later using electrical tests after the chip fabrication is completed.) The defect data is typically collected by laser scanning, optical, or scanning electron microscope ("SEM"). Defects may include a plurality of different events that may have very different respective impacts on chip yield. Any irregularities such as structural imperfections, particles, residuals, or embedded foreign material are considered as defects.

The inspection techniques often result in a total count of the number of defects detected in each process step, but not an abundance of in-depth or specific defect data. Total count information alone is not adequate for assigning good yield loss projections to defects detected at each particular process step.

It is common practice in the semiconductor industry, however, to inspect wafers at various times by employing inspection tools during production. The better the inspections, the better the data that can potentially shorten yield learning cycles by making it possible to react quickly to process problems. The process engineer therefore needs to know the number of defects per wafer, the x-y coordinates of each defect, and a set of parameters (different for different tools) specific for each particular defect. In order to know where to make corrections, it is necessary to map the actual defect data to the physical layout of the devices on a wafer. Such information can be crucial for maximizing yields of a product.

Speed is also critical for efficient manufacturing. Reviewing all the inspected defects, even using known automated classification, can significantly delay yield learning cycles and the subsequent manufacturing process for the semiconductor devices.

Therefore, a need exists for a method and system for quickly and efficiently isolating fault locations.

Solutions to these problems have been long sought but prior developments have not taught or suggested any solutions and, thus, solutions to these problems have long eluded those skilled in the art.

DISCLOSURE OF THE INVENTION

The present invention provides a method and system for fault isolation in semiconductor with devices thereon includes determining test data from a plurality of semiconductor devices and creating a failure bitmap of locations of the plurality of semiconductor devices and test data in a vector graphic CAD format. The vector graphic CAD format allows storage of test failure data as graphic shapes such as lines, paths and arbitrary polygons. Therefore vector graphic file formats store shape data as mathematical geometric representations. This process increases efficiency when storing failure data by compressing pixellized bitmap data and correlating it with locations and layout shapes.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
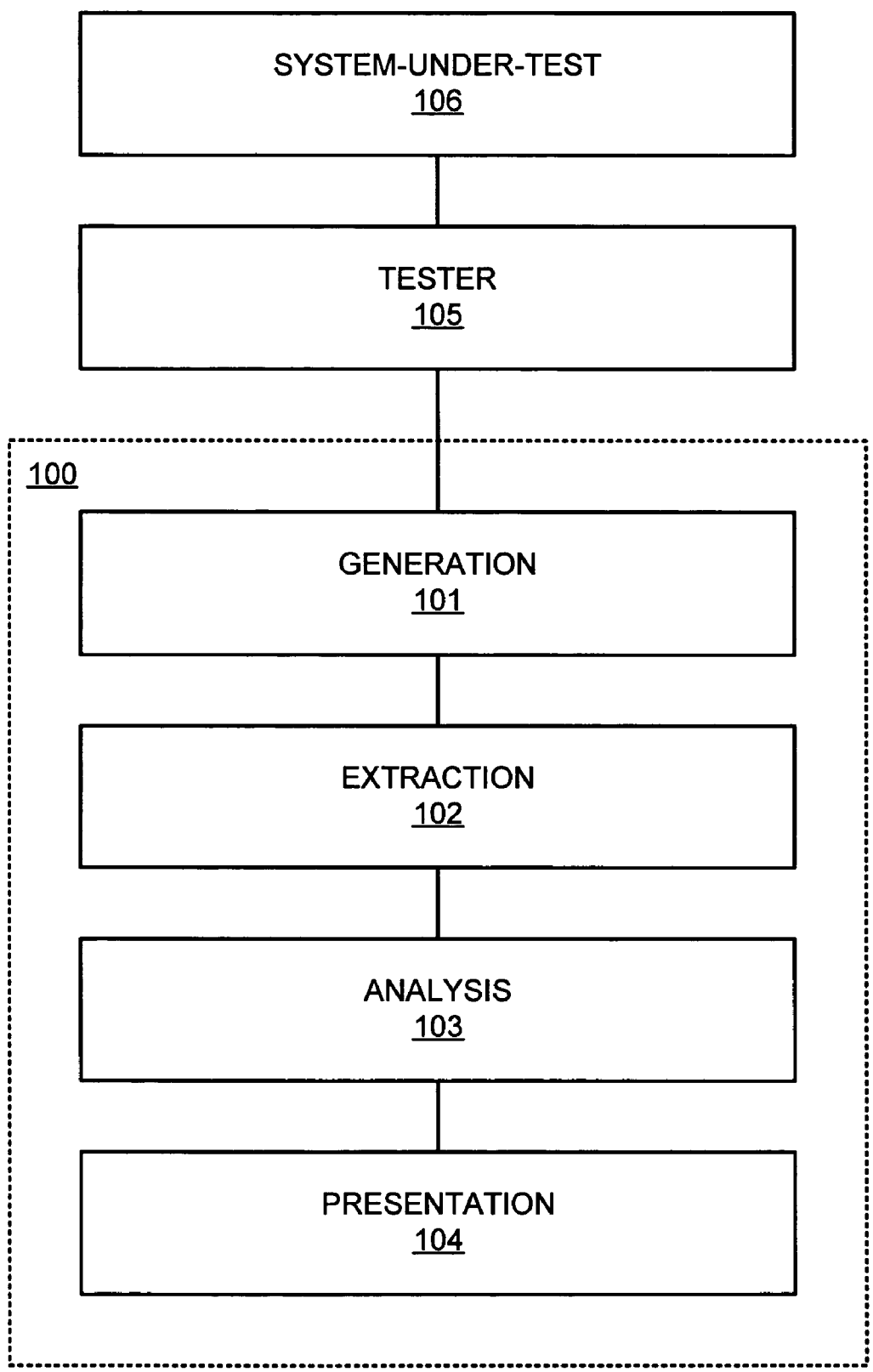
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are generation block 101, extraction block 102, analysis block 103, and presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

In the production of semiconductor devices, each process step must be developed and stabilized as quickly as possible. It is therefore essential to perform failure analysis rapidly, efficiently, and effectively, so that the results of the failure analysis can facilitate quick repair of the process defect that caused the failure.

Various kinds of failure analysis are performed with respect to each individual semiconductor device. In one process, a "failure bitmap", is generated in which the distribution condition of passes and failures is mapped and displayed in accordance with the physical location of the subject semiconductor devices. With the development of very large scale integration ("VLSr") devices, and ever larger and larger wafers, bitmaps are required to hold vast amounts of data. Significant problems occur in the storage and subsequent use of this data.

The state of the art format for storing failure data varies from one test system manufacturer to the next. Due to the large amounts of information to be stored, many of these test systems use compression schemes meant to store raster image data. Because of the varying formats and the compression, correlation between the failure data and the physical location of the subject semiconductor devices is a difficult and time-consuming process. In addition, many of the formats limit the amount of data that can be stored, oftentimes necessitating a different failure bitmap for each different test stimuli.

An additional problem occurs when attempting to correlate fail locations to device layout shapes or correlating logical combinations of layout shapes to fail data. The formats used to store test data are not graphics-based, making it difficult to perform these correlations.

In one embodiment according to the present invention, this need is met by storing failure data in a vector graphic geometric CAD (computer aided drafting) format. Examples of this format would be a GDS, an industry standard layout exchange format, CALMA Stream (also known as GDS-II), or CIF (CAD interchange format).

Vector graphic description formats are can be used for integrated circuit layout and allow for the storing of geometric data on multiple layers or planes. In the present invention, a vector graphic CAD format allows storage of test failure data as graphic shapes such as lines, paths and arbitrary polygons. Therefore, vector graphic file formats store shape data as mathematical geometric representations. This process increases efficiency when storing failure data by compressing pixellized bitmap data and correlating it with locations and layout shapes. Their use in this situation enables a failure bitmap to store different test data, such as such as data patterns, signal levels, and signal timing, on different layers or planes, thus increasing efficiency in storing the failure bitmap data.

In addition, vector graphic description formats typically include constructs to represent graphic primitives such as points, paths, arbitrary polygonal shapes, etc. This makes it easier to correlate layout shapes, which can also be stored in a vector graphic description format, with failure bitmap data.

Yield learning cycles are therefore accelerated by the present invention, defect causes are more quickly identified, and corrective yield impact projections are promptly and accurately easier to correlate fail locations to layout shapes, and to correlate logical combinations generated. The corresponding manufacturing process problems are then corrected and optimized more quickly, and process yields are correspondingly improved more rapidly.

This method is particularly effective for use with memory devices.

It will be readily understood, based upon this disclosure, that the same methodology and equipment of the present invention may also be used to analyze other semiconductor process data types that are currently treated as collections of individual data points. Examples include $V_t$ distributions, IV curves, and similar data point collections. The result is much faster and more accurate analyses that advantageously avoid current limitations such as manual classification, pre-defined (and thus potentially limiting) sets of classification codes, intensive computation, and so forth.

Figure 2:
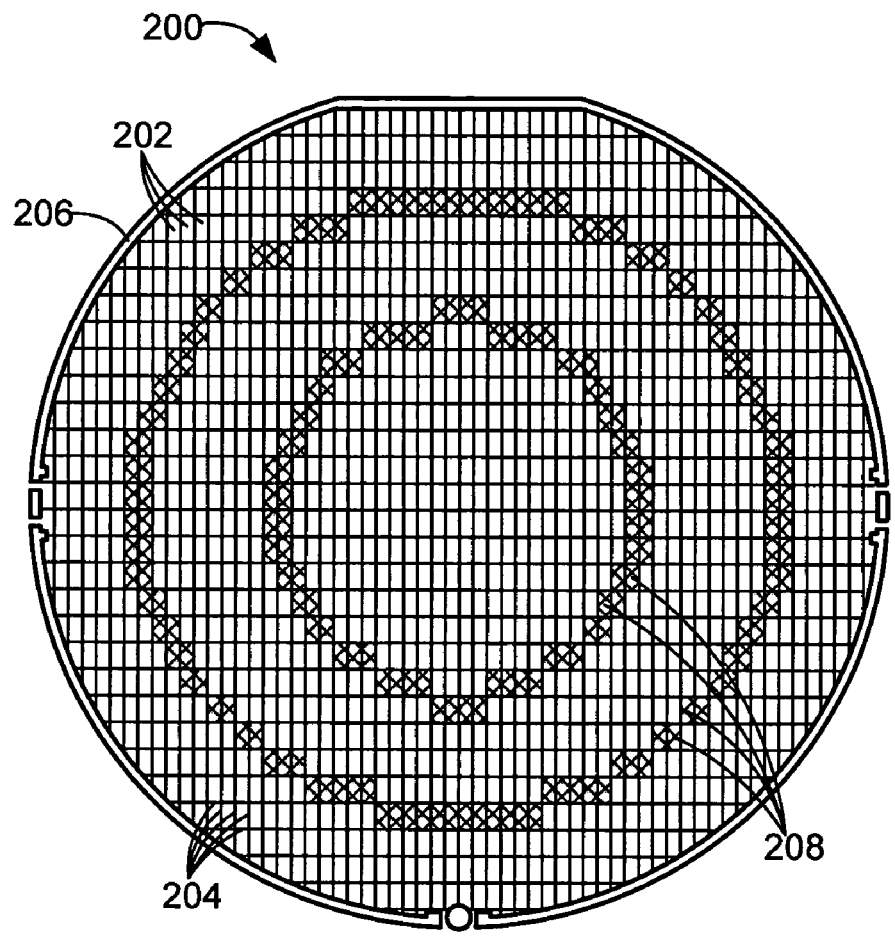
FIG. 2 shows a wafer 200 in an intermediate stage of manufacturing.

Referring now to FIG. 2, therein is shown a wafer 200 in an intermediate stage of manufacturing. Large numbers of dies 202, each having identical functional circuit patterns thereon, are located on the surface of the wafer 200. Each of the dies 202 is slightly separated from its neighboring dies by conventional scribe lines 204, to provide for individually separating the dies from the wafer 200 upon completion of the wafer manufacturing process. The edge of the wafer 200 along the periphery thereof is defined by a wafer edge area 206. Certain of the dies 202 have defects therein, and such dies are identified in the FIG. 2 by crosses 208 thereon.

In one wafer defect bitmap representational embodiment, the bitmap is displayed with a layout and appearance similar to the drawing of FIG. 2 herein. In some representational protocols of this type, as is known in the art, the level or degree of detail is much more extensive, so the drawing as shown in FIG. 2 will be understood to correspond to a simplified representation of those protocols. In a vector graphics description format of the present invention, the location of these defects could be stored and associated with the different test data on different associated layers and planes in the analysis block 103 of FIG. 1.

Figure 3:
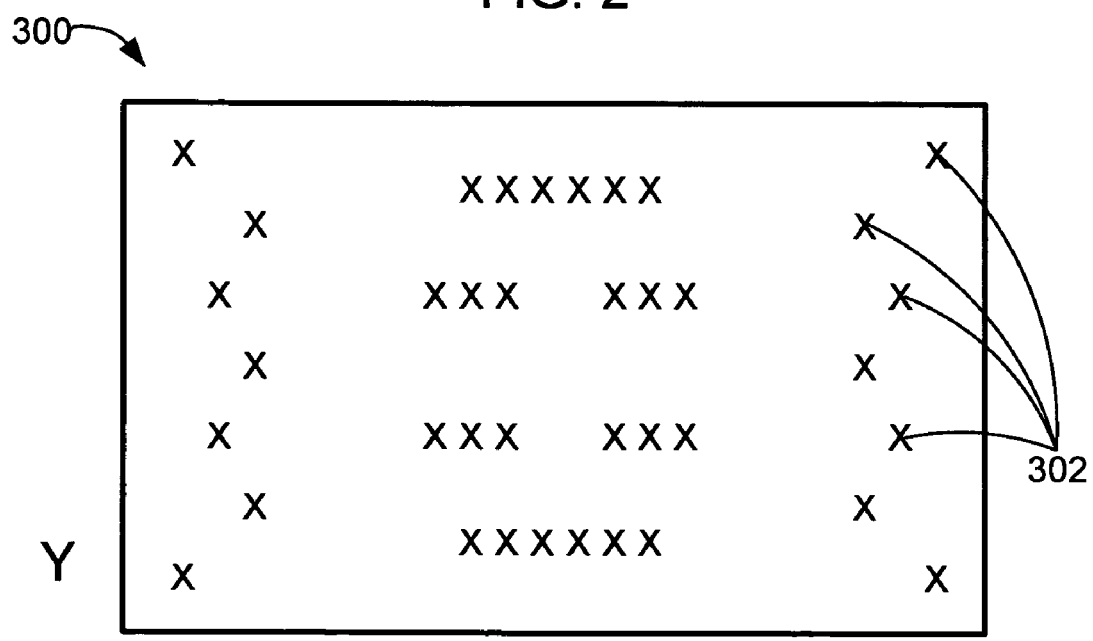
FIG. 3 is an X-Y bitmap of wafer defects.

Referring now to FIG. 3, therein is shown an X-Y bitmap 300 for a different wafer (not shown) having different defects than those in the wafer 200 (FIG. 2). In the X-Y bitmap 300, the locations of the defects are depicted on an X-Y grid in the locations designated by crosses 302 in the array that correlate to the die and defect locations on the related semiconductor wafer (not shown). In a vector graphics description format of the present invention, the coordinates of these points could be stored and associated with the different test data on different associated layers and planes in the analysis block 103 of FIG. 1.

While the defect patterns in FIGS. 2 and 3 are depicted generally symmetrically, it will be understood that the variety of patterns in practice is as diverse as the production and process defects that lead to wafer die defects and their corresponding bitmap patterns. As an example, asymmetrical defect clustering (not shown) toward one side of a wafer might indicate an uneven exposure to etchant. Such uneven exposure to etchant might occur when a wafer is immersed into an etchant in a manner that exposes one side of the wafer to the etchant noticeably longer than the opposite side in the analysis block 103 of FIG. 1.

Figure 4:
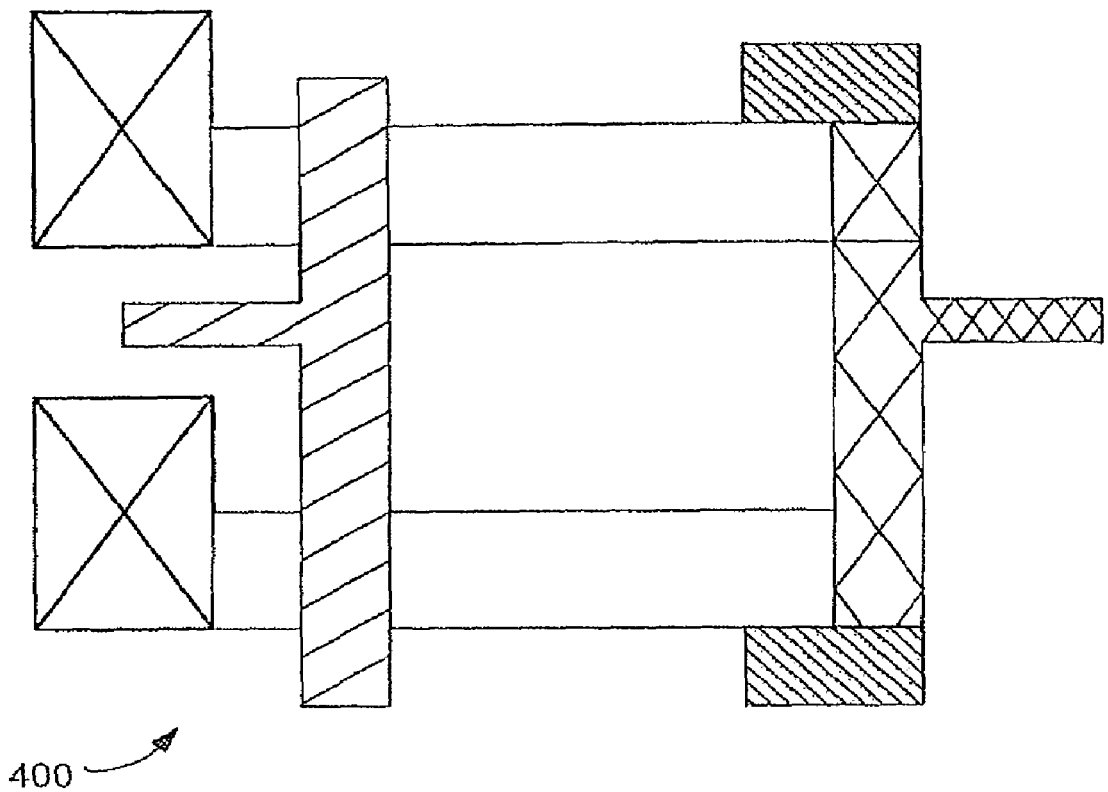
FIG. 4 is a device layout.

Referring now to FIG. 4, therein is shown a device layout 400. The device layout can also be described by a vector graphics description format including its composition, design, and location on a wafer. As the defect patterns in FIGS. 2 and 3 are also described in a vector graphics description format in the present invention, it is now easier to correlate the sets of information to determine which layout shapes correlate to which set of cell passes or failures in the analysis block 103 of FIG. 1.

Yield learning cycles are therefore accelerated by the present invention, defect causes are more quickly identified, and corrective yield impact projections are promptly and accurately easier to correlate fail locations to layout shapes, and to correlate logical combinations generated. The corresponding manufacturing process problems are then corrected and optimized more quickly, and process yields are correspondingly improved more rapidly.

Figure 5:
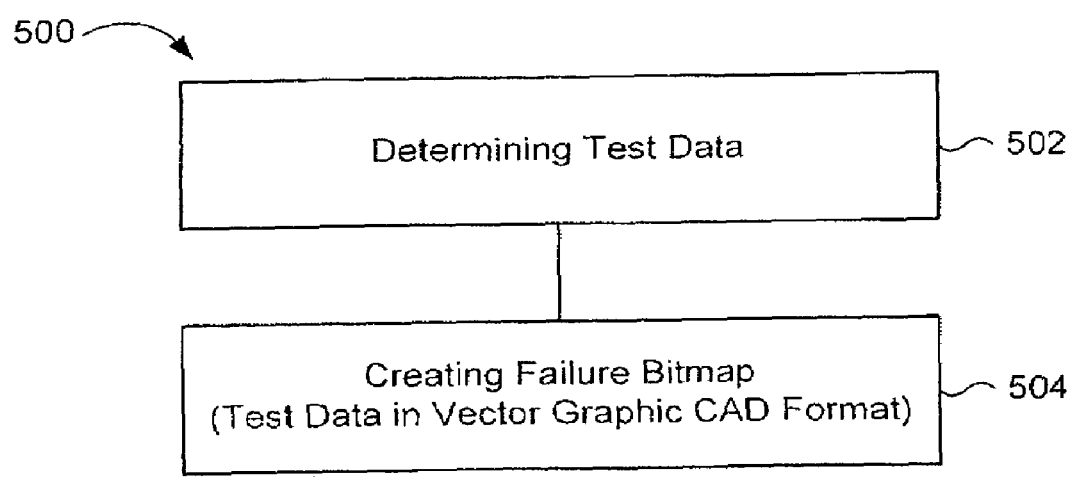
FIG. 5 is a system in accordance with an embodiment of the present invention.

Referring now to FIG. 5, therein is shown a system 500 in accordance with an embodiment of the present invention in which the blocks are steps in a method or circuitry for carrying out the steps. The system 500 includes: determining test data from a plurality of semiconductor devices in a block 502; and creating a failure bitmap of locations of the plurality of semiconductor devices and test data in a vector graphic CAD format in a block 504.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method for fault isolation in semiconductors with devices thereon comprising:

determining test data from a plurality of semiconductor devices by testing said plurality of semiconductor devices;

identifying test failure data from said test data, said test failure data corresponding to defects of said plurality of semiconductor devices; and creating a failure bitmap in a vector graphic computer-aided design (CAD) format, said failure bitmap including locations of said defects, said failure bitmap further including said test failure data;

said locations of said defects and said test failure data stored in said vector graphic CAD format.

2. The method as claimed in claim 1 wherein the vector graphic CAD format is selected from a group consisting of Graphic Data System (GDS), GDS-II, and CAD interchange format (CIF).

3. The method as claimed in claim 1 wherein the vector graphic CAD format allows storage of said test failure data on multiple layers.

4. The method as claimed in claim 1 further comprising correlating the failure bitmap with a layout representation of the plurality of semiconductor devices, said layout representation stored in a vector graphic description format.

5. The method as claimed in claim 1 further comprising correlating a logical combination of layout shapes of the semiconductor devices with the test failure data.

6. A method for fault isolation for semiconductor memory devices comprising:
   determining test data from a plurality of semiconductor memory devices by testing said plurality of semiconductor memory devices;
   identifying test failure data from said test data, said test failure data corresponding to defects of said plurality of semiconductor memory devices; and
   creating a failure bitmap in a vector graphic computer-aided design (CAD) format, said failure bitmap including locations of said defects, said failure bitmap further including said test failure data;
   said locations of said defects and said test failure data stored in said vector graphic CAD format.

7. The method as claimed in claim 6 wherein the vector graphic CAD format is selected from a group consisting of Graphic Data System (GDS), GDS-II, and CAD interchange format (CIF).

8. The method as claimed in claim 6 wherein the vector graphic CAD format allows storage of said test failure data on multiple layers as graphic shapes including lines, paths and arbitrary polygons.

9. The method as claimed in claim 6 further comprising correlating the failure bitmap with a layout representation of the plurality of semiconductor memory devices, said layout representation stored in a vector graphic description format.

10. The method as claimed in claim 6 further comprising correlating a logical combination of layout shapes of the semiconductor memory devices with the test failure data.

11. A system for fault isolation in semiconductors with devices thereon comprising:
    circuitry for determining test data from a plurality of semiconductor devices;
    circuitry for identifying test failure data from said test data, said test failure data corresponding to defects of said plurality of semiconductor devices; and
    circuitry for creating a failure bitmap in a vector graphic computer-aided design (CAD) format, said failure bitmap including locations of said defects, said failure bitmap further including said test failure data;
    said locations of said defects and said test failure data stored in said vector graphic CAD format.

12. The system as claimed in claim 11 wherein the vector graphic CAD format is selected from a group consisting of Graphic Data System (GDS), GDS-II, and CAD interchange format (CIF).

13. The system as claimed in claim 11 wherein the vector graphic CAD format allows storage of said test failure data on multiple layers.

14. The system as claimed in claim 11 further comprising circuitry for correlating the failure bitmap with a layout representation of the plurality of semiconductor devices, said layout representation stored in a vector graphic description format.

15. The system as claimed in claim 11 further comprising circuitry for correlating a logical combination of layout shapes of the semiconductor devices with the test failure data.

16. A system for fault isolation for semiconductor memory devices comprising:
    circuitry for determining test data from a plurality of semiconductor memory devices;
    circuitry for identifying test failure data from said test data, said test failure data corresponding to defects of said plurality of semiconductor memory devices; and
    circuitry for creating a failure bitmap in a vector graphic computer-aided design (CAD) format, said failure bitmap including locations of said defects, said failure bitmap further including said test failure data;
    said locations of said defects and said test failure data stored in said vector graphic CAD format.

17. The system as claimed in claim 16 wherein the vector graphic CAD format is selected from a group consisting of Graphic Data System (GDS), GDS-II, and CAD interchange format (CIF).

18. The system as claimed in claim 16 wherein the vector graphic CAD format allows storage of said test failure data on multiple layers as graphic shapes including lines, paths and arbitrary polygons.

19. The system as claimed in claim 16 further comprising circuitry for correlating the failure bitmap with a layout representation of the plurality of semiconductor memory devices, said layout representation stored in a vector graphic description format.

20. The system as claimed in claim 16 further comprising circuitry for correlating a logical combination of layout shapes of the semiconductor memory devices with the test failure data.

* * * * *